United States Patent [19]
Wiener

[11] 4,325,056
[45] Apr. 13, 1982

[54] BCD TO BINARY CONVERTER

[75] Inventor: Daniel P. Wiener, Glendale, Calif.

[73] Assignee: Burroughs Corporation, Detroit, Mich.

[21] Appl. No.: 180,255

[22] Filed: Aug. 22, 1980

Related U.S. Application Data

[63] Continuation of Ser. No. 26,176, Apr. 2, 1979.

[51] Int. Cl.³ .................... G06F 5/02; H03K 13/24
[52] U.S. Cl. .......................... 340/347 DD; 235/311
[58] Field of Search .......................... 235/310, 311; 340/347 DD

[56] References Cited

U.S. PATENT DOCUMENTS 3,449,555  6/1969  Wang .................... 340/347 DD
3,882,483  5/1975  Burke .................... 340/347 DD

OTHER PUBLICATIONS

Linford "Computer Design", Sep. 1970, pp. 53–61.
Beougher "Computer Design", Mar. 1970, pp. 53–59.

Primary Examiner—Charles D. Miller
Attorney, Agent, or Firm—Nathan Cass; Kevin R. Peterson; David G. Rasmussen

[57] ABSTRACT

A BCD to binary converter, particularly applicable for large numbers, employing an input level of code converter logic comprising PROM groups which provide a specially chosen initial conversion of the BCD number to be converted. Each PROM group comprises a plurality of individually programmed PROMs which provide for this initial conversion by directly converting successive sequential pairs of BCD digits into equivalent binary numbers taking into account their order of significance. A binary adder employing a plurality of PROM logic levels then provides for the binary addition of the binary bits produced by this initial conversion to provide the desired overall BCD to binary conversion.

7 Claims, 8 Drawing Figures

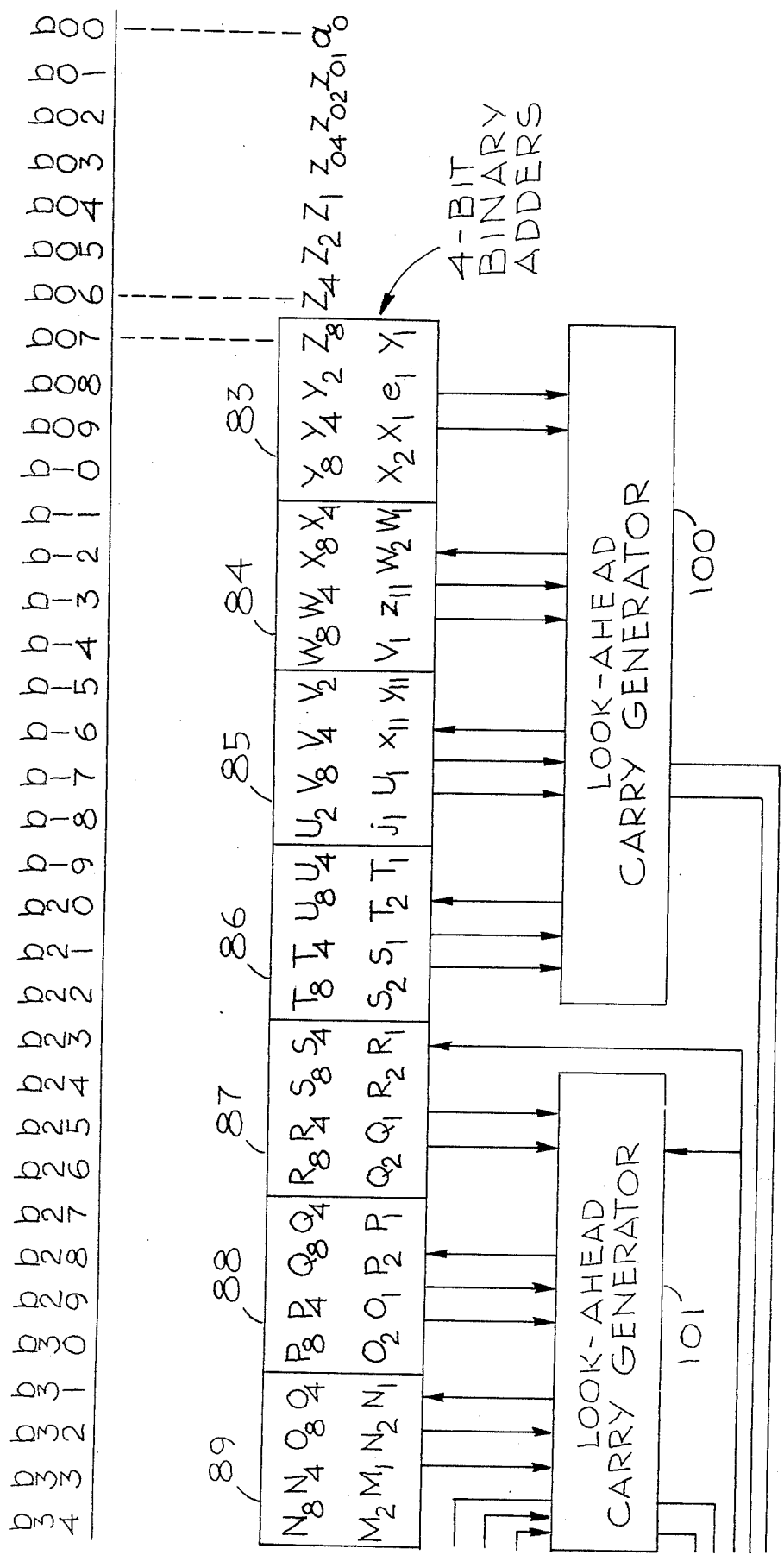
Fig. 5B  THIRD LEVEL OF LOGIC 16

BCD TO BINARY CONVERTER

This is a continuation of application Ser. No. 026,176, filed Apr. 2, 1979.

CROSS-REFERENCE TO RELATED APPLICATIONS

The commonly assigned, patent applications, Ser. No. 000,732, filed Jan. 3, 1979, for BCD-to-Binary Converter, and Ser. No. 000,729, filed Jan. 3, 1979, for Programmable Read-Only Memory Adder, inventors Laurence Paul Flora and Daniel Paul Wiener, are related to this application.

BACKGROUND OF THE INVENTION

This invention relates to improved means and methods for providing high speed conversion of binary coded decimal (BCD) numbers to straight binary form.

Decimal numbers are frequently introduced into digital computers in BCD form. An overwhelming majority of digital computers operate internally to the binary number system. A means and method for converting BDC to straight binary is required in the operation of digital computers.

Many ways for converting from BCD to binary are known to the prior art. Various of these known approaches are described and referenced in the article "A Method for High Speed BCD-to-Binary Conversion". L. C. Beougher, Computer Design, March 1973, pp. 53–59. The Beougher BCD-to-binary conversion approach is based on the addition of columns of BCD bits produced by a power of 2 expansion of each BCD digit. For example, the number 34567 can be expressed as $3(10^4)+4(10^3)+5(10^2)+6(10^1)+7(10^0)=3(2^{13}+2^{10}+2^9+2^8+2^4)+4(2^9+2^8+2^7+2^6+2^5+2^3)+5(2^6+2^5+2^2)+6(2^3+2^1)+7(2^0)$. The BCD representation of each digit is lined up under the corresponding binary bits (power of 2), and the entire set of expressions added up. The Beougher approach is implemented using a complex tree structure of 4-bit binary adders and look-ahead carry generators.

The embodiments disclosed in the above referenced related patent applications use as a starting point the same powers of 2 expansion as taught by Beougher. Improvement is achieved in the referenced applications by employing a novel arrangement of PROMs (programmable read-only memories) which achieves significantly faster BCD to binary conversion and a reduced hardware requirement when compared to the tree of adders approach.

Obviously, the expression of decimal numbers as powers of 2 grows rapidly in complexity. For example, 8 BCD digits expressed as powers of 2 prior to their being added up have two columns with 13 BCD bits to be added. Going to just 12 BCD digits means that at least one column would have 19 BCD bits to be added.

SUMMARY OF THE INVENTION

The present invention is directed to improvements in the above described cross-referenced, related patent applications wherein BCD to binary conversion is achieved in the present invention using a fast hardware conversion means and method which can efficiently apply to an unlimited number of BCD digits.

In a preferred embodiment of the invention, an input code converter logic level is provided for initially converting successive sequential pairs of decimal digits into long binary numbers taking into account their order of significance. The bits of these long binary numbers are then added up to produce the desired overall BCD to binary conversion. Preferably, individually programmed PROMs are employed for the initial conversion as well as for the binary addition. For example, the number 34567 can be initially converted using this sequential pair approach as follows: $34567=34(10^3)+56(10^1)+7(10^0)$. $34(10^3)=1000010011010000$; $56(10^1)=1000110000$; $7(10^0)=111$. Note that the least significant digit "7" is not paired since the number 34567 has an odd number of digits. Adding these three binary numbers produced by this initial conversion produces $34567=1000011100000111$, which is the desired true binary equivalent of the input BCD number. It will be recognized that only three rows of bits have to be added using this approach, as compared to up to seven rows for the powers-of-2 representation described above. Furthermore, as the number of input digits increases, the circuit complexity required for the approach of the present invention increases at a rate which is less than the square of the number of digits, while conversion time increases only very slowly, thereby advantageously providing for the expeditious BCD to binary conversion of BCD numbers having large numbers of BCD digits. As an example, 21 BCD digits can be converted in accordance with a preferred embodiment of the invention to 70 bits of true binary in the order of 157 nanoseconds using 130 PROMs, 16 adders and 5 look-ahead carry generators, a total of 151 integrated circuit chips. A BCD number of 80 digits can be converted to 266 binary bits in the order of 250 nanoseconds using in the order of 1850 integrated circuit chips. By way of contrast, the powers of 2 expansion approach taught by Beougher and employed in the preferred embodiment of the cross-referenced, related patent applications typically convert 7 BCD digits to 24 bits of binary in 101 nanoseconds using 17 PROMs, 4 adders, 1 look-ahead carry generator, 1 XOR gate and 1 AND gate. Furthermore, the complexity and conversion time required by the powers of 2 expansion approach increases at a greater rate than the present invention.

The specific nature of the invention as well as other objects, advantages and features thereof will become readily apparent from the following detailed description of a preferred embodiment taken in conjunction with the accompanying drawings.

BRIEF DESCRIPTION OF THE DRAWINGS

FIGS. 3A and 3B will hereinafter be referred to as FIG. 3.

FIGS. 4A and 4B will hereinafter be referred to as FIG. 4.

FIGS. 5A and 5B (placed side-by-side with FIG. 5A on the left) together constitute a schematic diagram illustrating a preferred embodiment of the third level of logic 16 of FIG. 1. FIGS. 5A and 5B will hereinafter be referred to as FIG. 5.

DESCRIPTION OF THE PREFERRED EMBODIMENT

Figure 1:
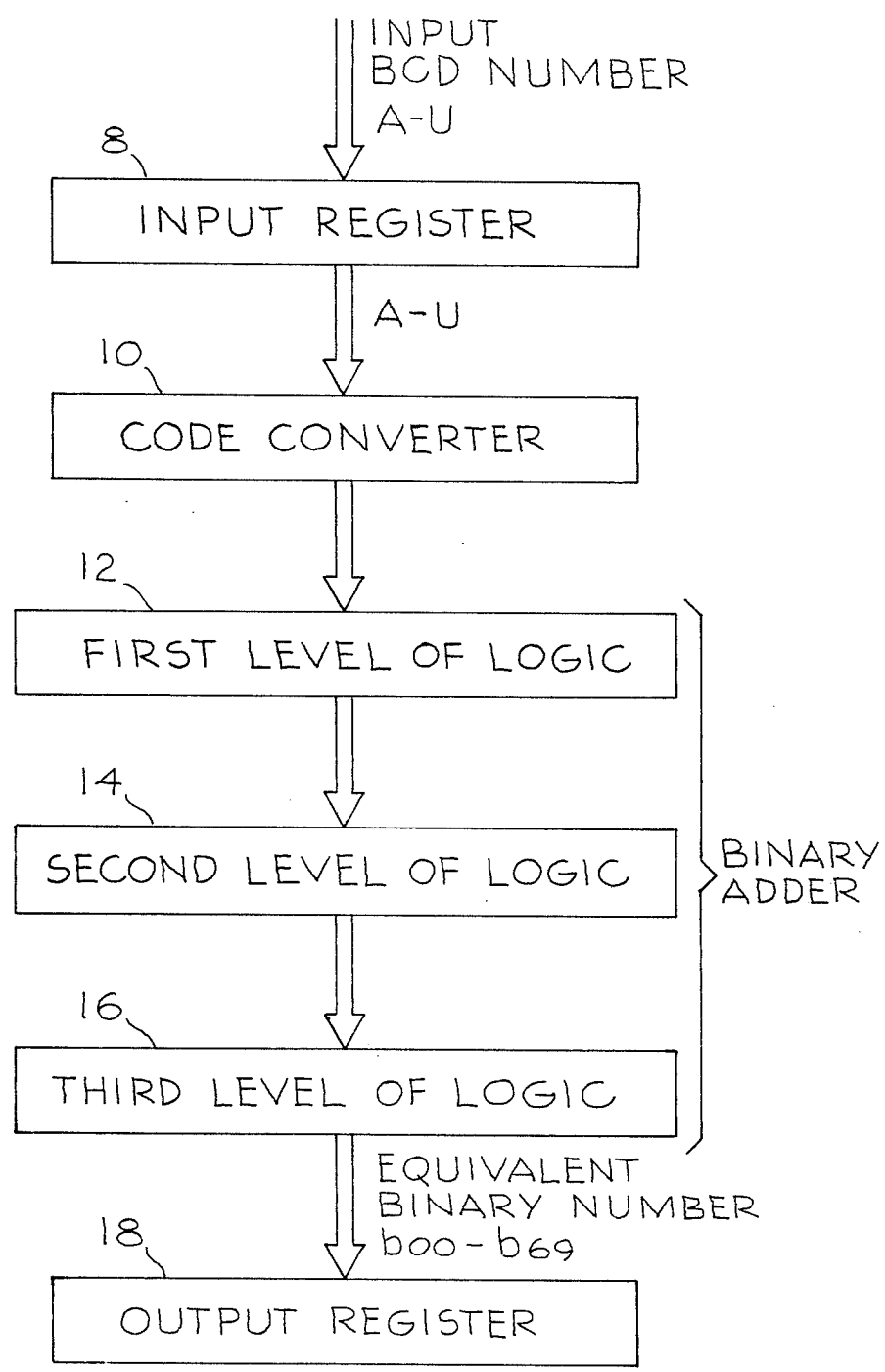
FIG. 1 is an overall block diagram of a preferred embodiment of a BCD-to-binary converter in accordance with the invention.

An overall block diagram of a preferred embodiment of the invention for an improved BCD to binary converter for large numbers is depicted in FIG. 1. For illustrative purposes, FIG. 1 shows a 21 digit BCD number A-U converted to a 70 bit binary number $b_{00}$-$b_{69}$. The particular length of number is selected merely for illustrative purposes. It will become apparent to those skilled in the art that the same basic approach can readily be applied to handle almost any size of BCD number by modifying the number of stages and levels of logic in accordance with the invention.

Illustrated in FIG. 1 is an input register 8 together with code converter logic 10, first, second and third levels of logic 12, 14 and 16 and an output register 18. The input register 8, implemented as known in the prior art, receives the BCD input bits representative of the 21 digit BCD number A-U for storage and for processing to the code converter 10. The code converter 10 comprises 77 PROMs for providing an initial conversion which converts successive sequential pairs of BCD input digits to their equivalent binary form taking into account their order of significance, as will be explained in detail below. The input BCD number A-U may typically comprise the 21 BCD digits A,B,C,D,E,F,G,H,I,J,K,L,M,N,O,P,Q,R,S,T,U wherein A is the least significant digit. The resulting converted true binary number is illustrated by binary outputs $b_{00}$-$b_{69}$ provided from the third level of logic 16. Binary outputs $b_{00}$-$b_{69}$ comprise binary bits $b_{00}$, $b_{01}$, $b_{02}$, $b_{03}$, $b_{04}$, $b_{05}$—$b_{69}$ wherein $b_{00}$ is the least significant bit.

The binary bits produced by the initial conversion provided by code converter 10 are then added by the first, second and third levels of logic 12, 14 and 16 which are preferably implemented as taught in the aforementioned related patent applications as will next be generally considered prior to a more detailed consideration of code converter 10.

Figure 3A:
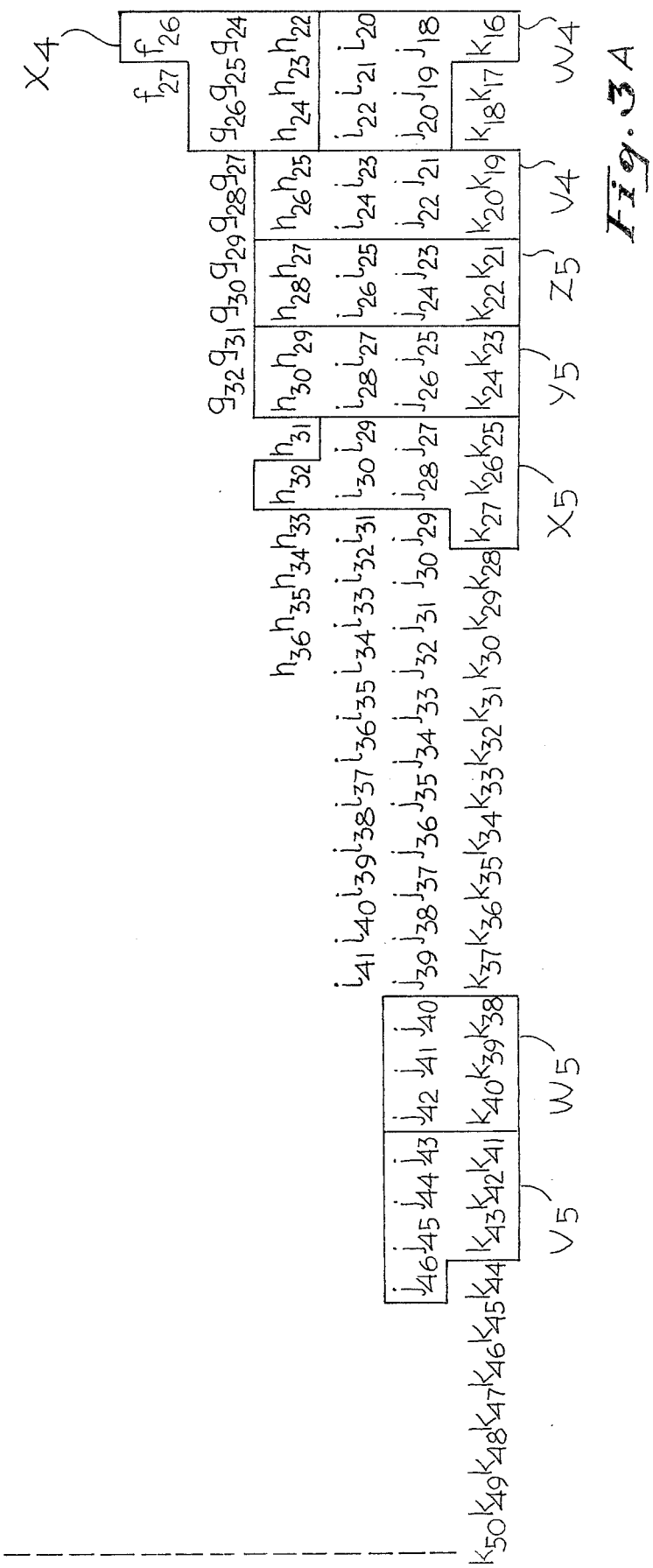
FIGS. 3A and 3B (placed side-by-side with FIG. 3A on the left) together constitute a schematic diagram illustrating a preferred embodiment of the first level of logic 12 of FIG. 1.
Figure 3B:
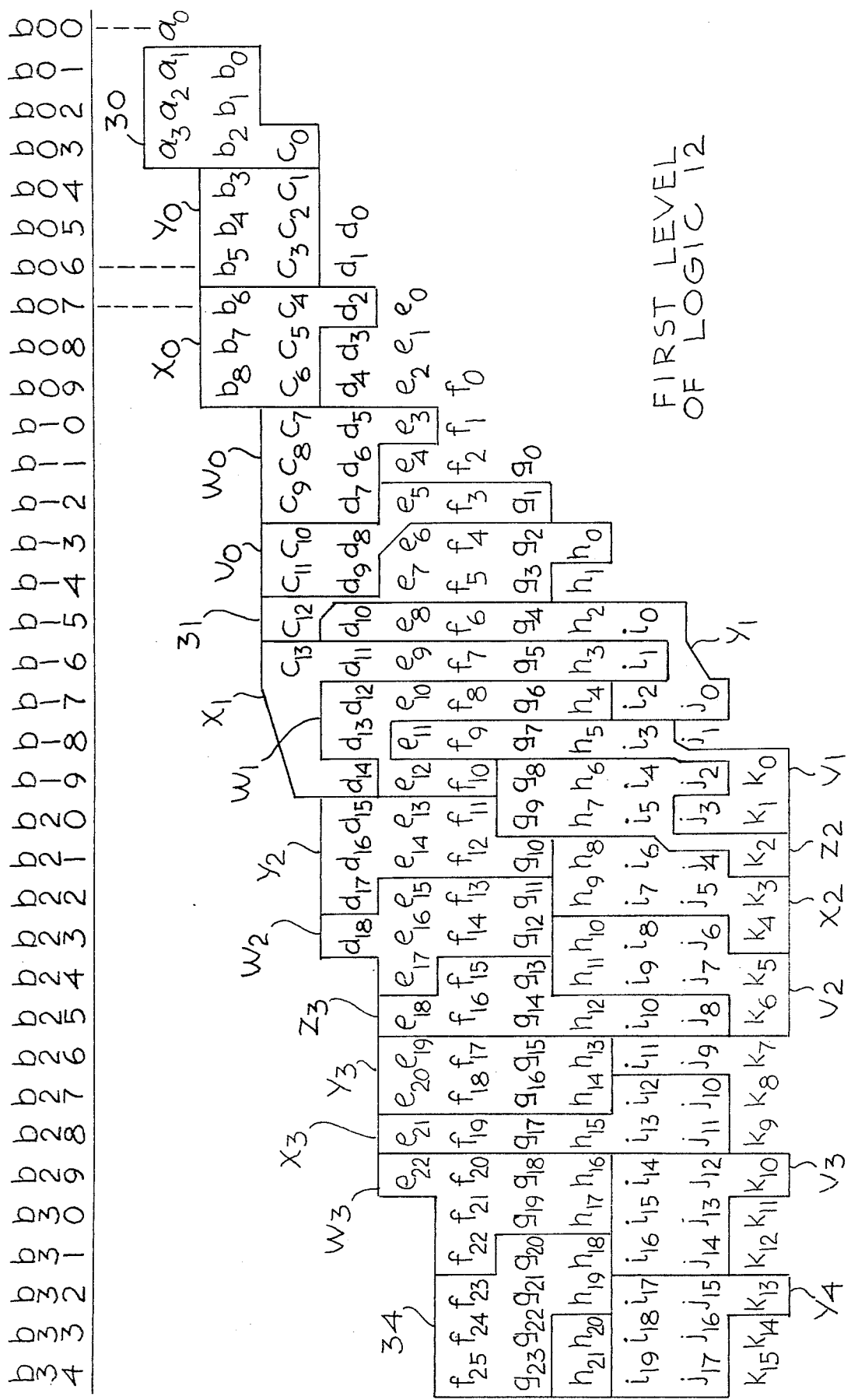

Referring to FIGS. 1 and 3, the input bits to the first level of logic 12 are separated into two groups; namely, those binary bits which are not applied to PROMs and are not enclosed by boundary lines and those binary bits which are applied to PROMs for addition and are enclosed by boundary lines. Each boundary line enclosure represents one PROM. The first level of logic 12 comprises 30 PROMs referenced by the lower-case alphabet symbols $v_0$-$v_5$, $w_0$-$w_5$, $x_0$-$x_5$, $y_0$-$y_5$ and $z_0$-$z_5$ inclusive. For example, the symbols $v_0$-$v_5$ represent the six PROMs $v_0$, $v_1$, $v_2$, $v_3$, $v_4$, $v_5$. The binary outputs of PROM $v_0$ are $v_{01}$, $v_{02}$, $v_{04}$, $v_{08}$, wherein $v_{01}$ is the least significant bit, and the weighting values of $v_{01}$, $v_{02}$, $v_{04}$ and $v_{08}$ are 1, 2, 4 and 8 respectively. The binary outputs of PROM $v_1$ are $v_{11}$, $v_{12}$, $v_{14}$, $v_{18}$. The binary outputs of all the PROMs in the first level logic 12 are referenced in a similar manner as illustrated above for PROMS $v_0$ and $v_1$.

Figure 4A:
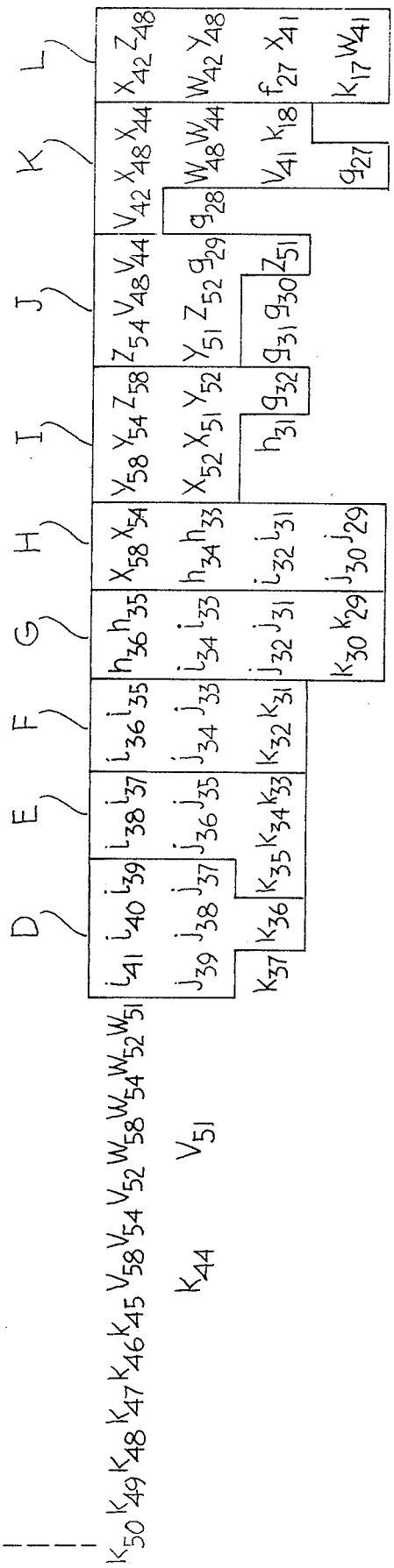
FIGS. 4A and 4B (placed side-by-side with FIG. 4A on the left) together constitute a schematic diagram illustrating a preferred embodiment of the second level of logic 14 of FIG. 1.
Figure 4B:
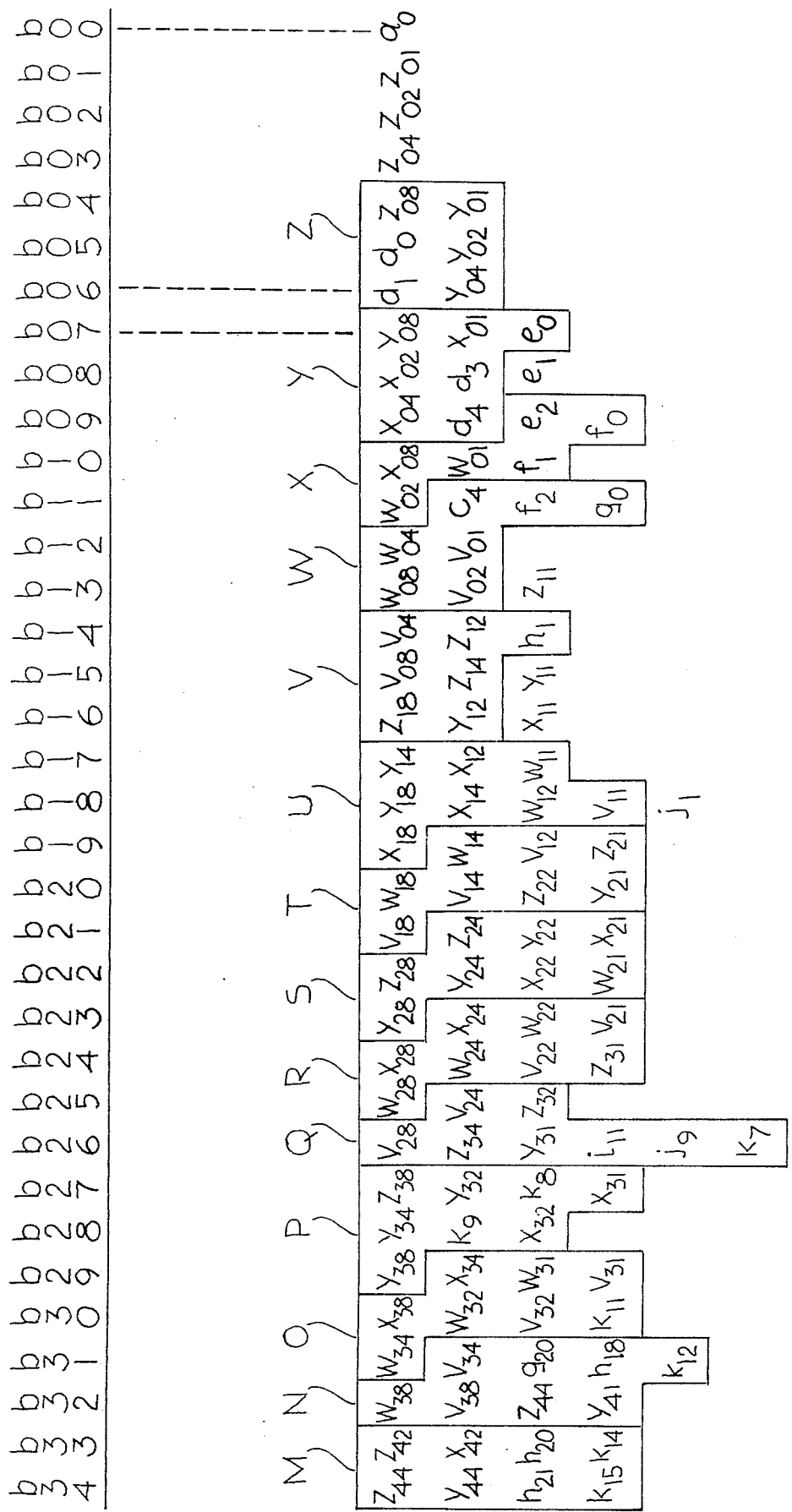
Figure 5A:
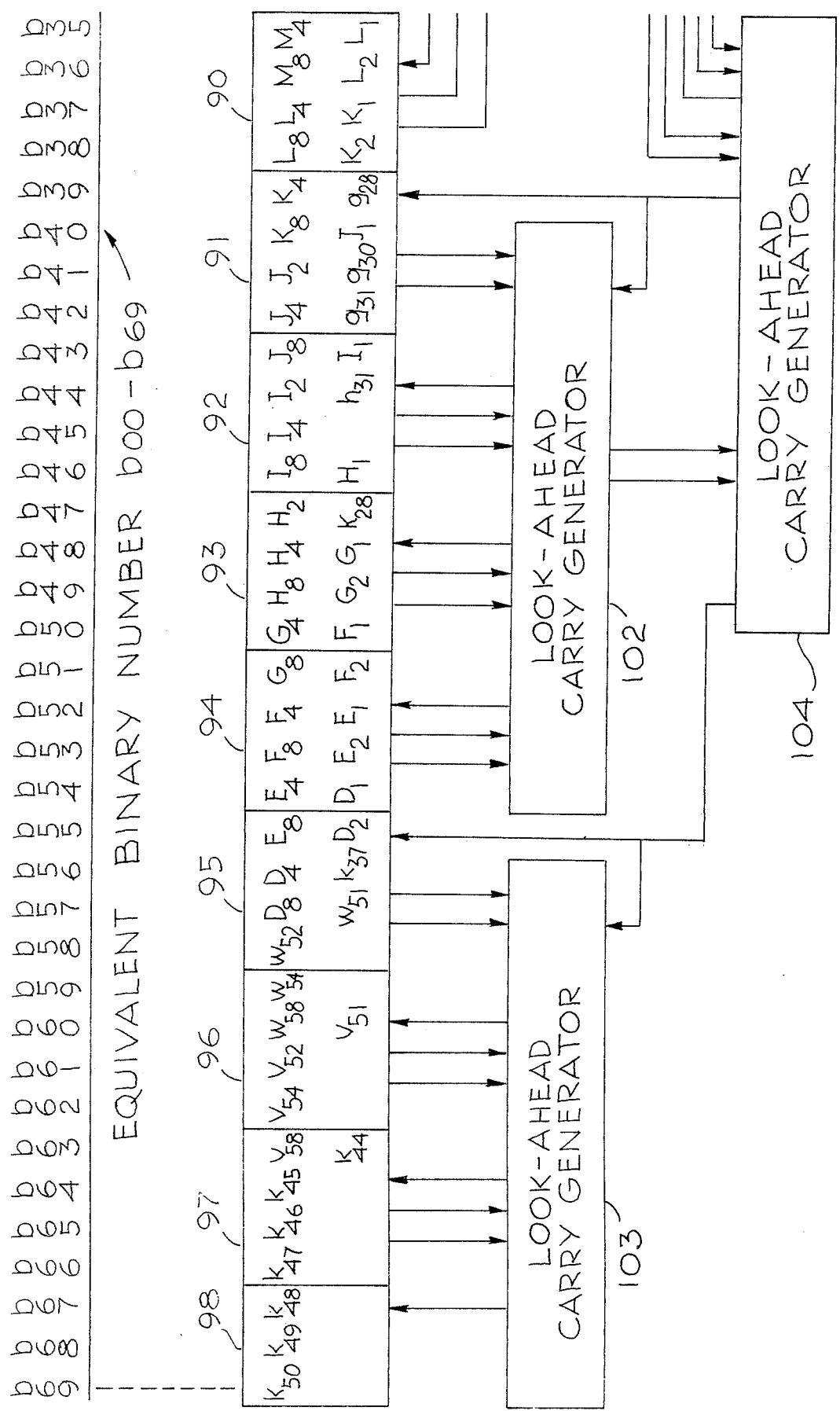

Referring to FIGS. 1 and 4, binary bits are applied from the first level of logic 12 to the second level of logic 14 for addition. The input bits to the second level of logic 14 are separated into two groups; namely, binary bits which are not applied to PROMs and are not enclosed by boundary lines and binary bits which are applied to PROMs for addition and are enclosed by boundary lines. The second level of logic 14 comprises 23 PROMs referenced by capital letters D-Z inclusive. The binary inputs to PROM Z, for example, are $z_{08}$, $d_0$, $d_1$, $y_{01}$, $y_{02}$, $y_{04}$. The binary inputs to PROM D are $i_{39}$, $i_{40}$, $i_{41}$, $j_{37}$, $j_{38}$, $j_{39}$, $k_{36}$. In a similar manner the individual binary bit inputs to each of PROMs D-Z are illustrated in FIG. 4. Referring to FIGS. 4 and 5 the output bits of PROM Z are the 4 bits $Z_1$, $Z_2$, $Z_4$, $Z_8$. The output bits of PROM D are $D_1$, $D_2$, $D_4$, $D_8$. Accordingly, the output bits of the second level of logic 14 PROMs D-Z are determined in accordance with the above examples given for PROMs D and Z.

Referring to FIGS. 1 and 5, the first and second levels of logic 12 and 14 respectively, progressively reduce the binary numbers to be added to two rows for application to the third level of logic 16. Binary bits are provided from the second level of logic 14 and applied to the third level of logic 16 in two rows wherein the final step of addition is performed. The third level of logic 16 comprises 16 4-bit binary adders 83-98 and 5 look-ahead carry generators 100-104 connected to form a conventional adder circuit well known in the prior art. The third level of logic 16 produces the binary output bits $b_{00}$-$b_{69}$ which represent the binary equivalent value of the input BCD digits A-U. Referring to FIG. 1, the output register 18, implemented as well known in the prior art, receives the binary output $b_{00}$-$b_{69}$ from the third level of logic 16 for storage and for further processing.

Having generally described a preferred implementation for logic levels 12, 14 and 16, a preferred implementation for code converter 10 will next be considered.

Figure 2:
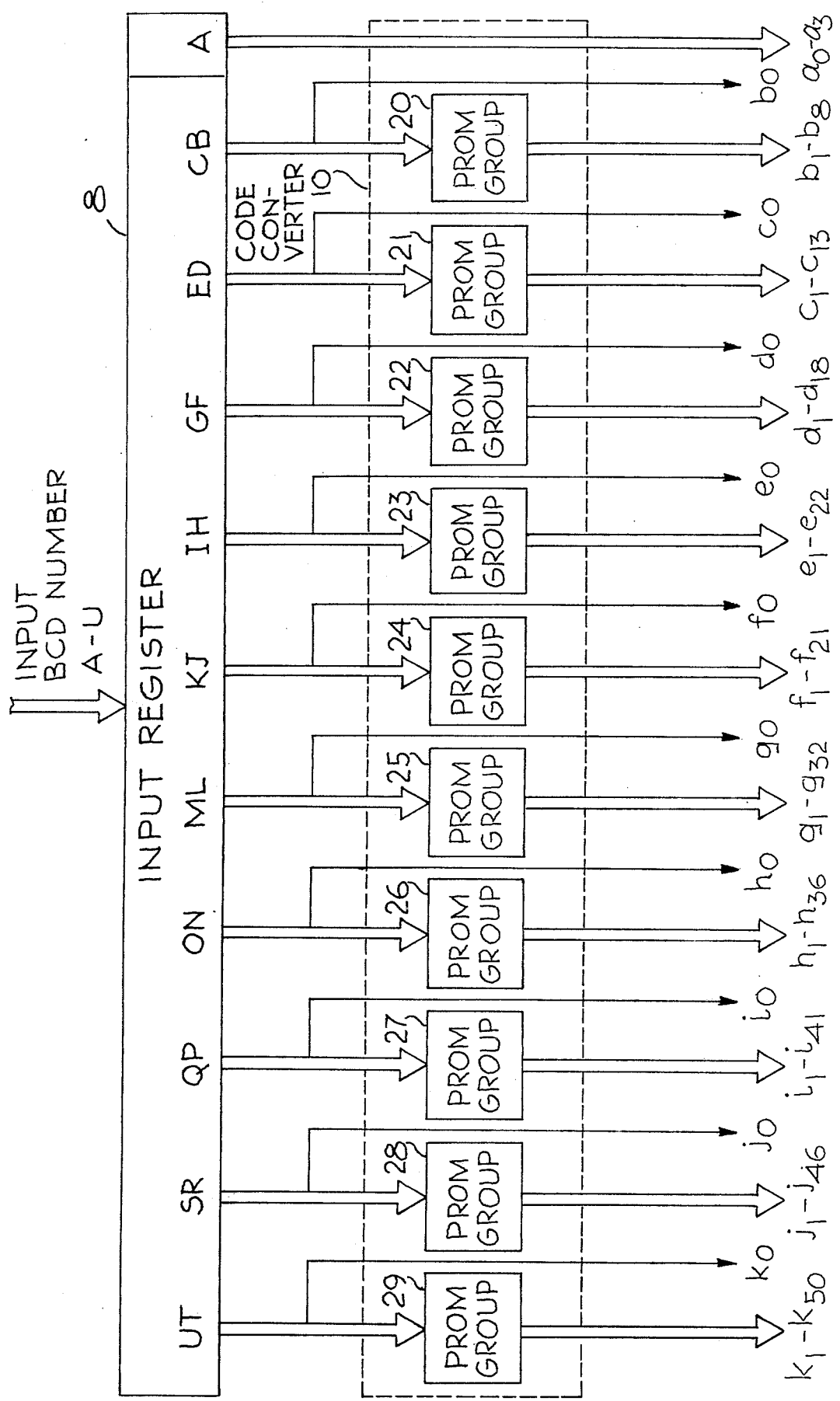
FIG. 2 is a schematic diagram illustrating a preferred embodiment of the code converter logic 10 of FIG. 1.

Referring to FIGS. 1 and 2, an arbitrary 21 digit BCD number A-U will be assumed to be applied to code converter logic 10 which may be represented as:

U T S R Q P O N M L K J I H G F E D C B A, where each letter represents a digit. The number can also be represented in the form of successive sequential pairs as follows:

TABLE I $$\begin{aligned}
& UT * 10^{19} \\
+ & SR * 10^{17} \\
+ & QP * 10^{15} \\
+ & ON * 10^{13} \\
+ & ML * 10^{11} \\
+ & KJ * 10^{9} \\
+ & IH * 10^{7} \\
+ & GF * 10^{5} \\
+ & ED * 10^{3} \\
+ & CB * 10^{1} \\
+ & A * 10^{0}
\end{aligned}$$

Each of the above pairs of BCD digits is associated with a power of ten value chosen in accordance with its order of significance—that is, its columnar position in the input BCD number to be converted. Code converter 10 operates to convert each of these pairs into an equivalent binary number, taking into account the associated power of 10 value. Preferably, this is implemented using a plurality of 256×4 bit PROMs, as will be described in detail hereinafter.

A preferred manner in which the conversion provided by code converter 10 may be implemented using PROMs is illustrated by the tables below.

TABLE 2

0 PROMs will convert A * $10^0$ to 4 binary bits (times $2^0$)
2 PROMs will convert CB * $10^1$ to 9 binary bits (times $2^1$)
4 PROMs will convert ED * $10^3$ to 14 binary bits (times $2^3$)
5 PROMs will convert GF * $10^5$ to 19 binary bits (times $2^5$)
6 PROMs will convert IH * $10^7$ to 23 binary bits (times $2^7$)

TABLE 2-continued

7 PROMs will convert KJ * $10^9$ to 28 binary bits (times $2^9$)
8 PROMs will convert ML * $10^{11}$ to 33 binary bits (times $2^{11}$)
9 PROMs will convert ON * $10^{13}$ to 37 binary bits (times $2^{13}$)
11 PROMs will convert QP * $10^{15}$ to 42 binary bits (times $2^{15}$)
12 PROMs will convert SR * $10^{17}$ to 47 binary bits (times $2^{17}$)
13 PROMs will convert UT * $10^{19}$ to 51 binary bits (times $2^{19}$)
77 PROMs TOTAL

TABLE 3

Referring to FIGS. 2 and 3:

| BCD | | Binary |
|---|---|---|
| A * $10^0$ | converts to | $a_0$-$a_3$ (times $2^0$) |
| CB * $10^1$ | " | $b_0$-$b_8$ (times $2^1$) |
| ED * $10^3$ | " | $c_0$-$c_{13}$ (times $2^3$) |
| GF * $10^5$ | " | $d_0$-$d_{18}$ (times $2^5$) |
| IH * $10^7$ | " | $e_0$-$e_{22}$ (times $2^7$) |
| KJ * $10^9$ | " | $f_0$-$f_{27}$ (times $2^9$) |
| ML * $10^{11}$ | " | $g_0$-$g_{32}$ (times $2^{11}$) |
| ON * $10^{13}$ | " | $h_0$-$h_{36}$ (times $2^{13}$) |
| QP * $10^{15}$ | " | $i_0$-$i_{41}$ (times $2^{15}$) |
| SR * $10^{17}$ | " | $j_0$-$j_{46}$ (times $2^{17}$) |
| UT * $10^{19}$ | " | $k_0$-$k_{50}$ (times $2^{19}$) |

The above eleven binary numbers of Table 3 are added together by logic levels 12, 14 and 16, as described previously, to produce the desired 70 bit conversion to the equivalent binary number $b_{00}$-$b_{69}$. The code converter 10 of FIGS. 1 and 2 produces the columnar arrangement ready for addition as illustrated in FIG. 3, derived from Table 3 above, which represents the binary bits having weighting values of powers of two as a result of the conversion of the pairs of BCD digits taking into account their associated power of 10 value.

As illustrated in FIG. 2, for the code converter logic 10, adjacent pairs of BCD digits such as CB, ED and so on, provide the inputs to groups of PROMs as represented by PROM group 20, PROM group 21 and continuing to PROM group 29. Each pair of BCD digits in Table 1 of A-U above represents 100 possible numbers from 0-99 times a power of ten. Each of the 100 possible numbers, 0-99 times a power of ten, may be represented by a long binary number times a power of two as shown in Table 3 above. A maximum of 8 BCD bits are provided to the input of each 256×4 bit PROM contained within the PROM groups 20, 21,—29. Each PROM of 8 inputs and 4 outputs is programmed with a table look-up method, well known in the prior art, to provide a 4-bit slice of the long binary number equal in value to the pair of BCD inputs. A predetermined quantity of PROMs, as indicated in Table 2 above, are grouped together to provide the long binary number which represents the identical value of the BCD number provided to the PROMs. Referring to FIG. 2 and Table 2 above, PROM group 20 which converts BCD digits CB comprises 2 individual PROMs, PROM group 21 which converts BCD digits ED comprises 4 individual PROMs and so on.

There is a separate 100 entry table look-up for each pair of BCD digits to provide the binary output from code converter 10 exclusive of the binary LSB as explained further in the disclosure. Each 4-bit slice of the binary output of a PROM group is provided by one PROM in each group of PROMs. The accumulation of 4-bit slices provided by each PROM in a PROM group provides the total number of binary bits required to represent a pair of BCD digits times a power of 10. Referring to FIG. 2, for example, the pair of BCD digits CB converts to 9 binary bits $b_0$-$b_8$. Bit $b_0$ converts directly without going through a PROM. Binary bits $b_1$, $b_2$, $b_3$, $b_4$ are provided by one of the 2 PROMs included within the PROM group 20. Binary bits $b_5$, $b_6$, $b_7$, $b_8$ are provided by the second of the 2 PROMs represented by PROM group 20. The nine bits $b_0$-$b_8$ provided by the code converter 10 to the first level of logic 12 represents, in binary form, the identical value of the pair of BCD digits CB. Using a similar implementation, the PROM groups 20-29 in the code converter 10 of FIG. 2 convert the pairs of BCD digits to binary bits. Referring to FIG. 2 and Table 4 below it is understood that each PROM group includes individually programmed PROMs and that each PROM group forms a channel. A sequential series of PROM groups are arranged to receive BCD digits sequentially from the least significant to the most significant BCD digit, the sequential series comprising PROM groups 20-29 inclusive.

TABLE 4

| PROM GROUP | PAIRS OF BCD DIGITS | BINARY LSB | BINARY BITS PROVIDED BY PROMs | TOTAL BINARY BITS EQUAL IN VALUE TO THE PAIR OF BCD DIGITS |
|---|---|---|---|---|
| 20 | CB | $b_0$ | $b_1$-$b_8$ | $b_0$-$b_8$ |
| 21 | ED | $c_0$ | $c_1$-$c_{13}$ | $c_0$-$c_{13}$ |
| 22 | GF | $d_0$ | $d_1$-$d_{18}$ | $d_0$-$d_{18}$ |
| 23 | IH | $e_0$ | $e_1$-$e_{22}$ | $e_0$-$e_{22}$ |
| 24 | KJ | $f_0$ | $f_1$-$f_{27}$ | $f_0$-$f_{27}$ |
| 25 | ML | $g_0$ | $g_1$-$g_{32}$ | $g_0$-$g_{32}$ |
| 26 | ON | $h_0$ | $h_1$-$h_{36}$ | $h_0$-$h_{36}$ |
| 27 | QP | $i_0$ | $i_1$-$i_{41}$ | $i_0$-$i_{41}$ |
| 28 | SR | $j_0$ | $j_1$-$j_{46}$ | $j_0$-$j_{46}$ |
| 29 | UT | $k_0$ | $k_1$-$k_{50}$ | $k_0$-$k_{50}$ |

To implement the table look-up in practice, a computer using known methods goes through the 100 numbers to calculate the binary representations and to slice the output binary bits into 4's for each PROM. Then, using known methods, each table look-up is permanently programmed into each PROM.

Referring to FIG. 2, the single BCD digit A is directly converted to binary $a_0$-$a_3$ without implementation through a PROM or other circuit elements. In addition, the LSB of each pair of BCD digits converts directly to the LSB of its corresponding binary number without employing PROMs or other circuit elements. A single BCD digit representing a decimal number from 0-9 has the identical 4-bit configuration as a binary number representing the corresponding decimal number 0-9. Decimal 0 equals BCD 0000 equals binary 0000. Decimal 1 equals BCD 0001 equals binary 0001, decimal 2 equals BCD 0010 equals binary 0010 and so on to decimal 9 which equals BCD 1001 which equals binary 1001.

The LSB of the binary number which represents the identical value of a BCD digit or a pair of BCD digits is identical to the LSB of the BCD digits. For illustrative purposes, an example of an odd number is:

| Decimal | BCD | Binary |
|---|---|---|
| 45 | 0100 0101 | 101101 |
| | ↑ | ↑ |
| | LSB | LSB |

An example of an even number is:

| Decimal | BCD | Binary |
|---------|-----|--------|
| 46 | 0100 0110 | 101110 |
|  | ↑ | ↑ |
|  | LSB | LSB |

Thus, when converting from a BCD number to its representative binary number, the LSB of the BCD number is converted directly and also applied to a PROM input. This is illustrated in FIG. 2 by the binary bits $b_0$, $c_0$, $d_0$—$k_0$ inclusive. By employing this principle, the number of PROMs required to implement the conversion of a large BCD number directly to binary can be reduced. Referring again to FIG. 2 and Table 2 above, for example, CB times $10^1$ converts to 9 binary bits times $2^1$. Ordinarily 3 PROMs of 4 bits output each would be required to perform the conversion. By implementing the above characteristic, the conversion is completed using only 2 PROMs, representing a savings of 1 PROM.

In the table look-up for the 100 possible numbers for each PROM group in FIG. 2, it is possible that some combinations of binary bits cannot occur. For certain binary numbers, as explained below, if the MSB is true, certain other bits cannot simultaneously be true if the result would be that the maximum possible value of the stored number would be exceeded. Taking $GF \times 10^5$ from Table 3 above as an example, the value of each binary bit $d_0$-$d_{18}$ representative of the BCD number $GF \times 10^5$ is given as follows:

TABLE 5

|  |  | Binary weight | Decimal value |
|---|---|---|---|
| ↑ | 0 | $2^0$ | — |
| ↑ | 0 | $2^1$ | — |
| represents | 0 | $2^2$ | — |
| times | 0 | $2^3$ | — |
| $10^5$ | 0 | $2^4$ | — |
| ↑ | $d_0$ | $2^5$ | 32 |
| ↑ | $d_1$ | $2^6$ | 64 |
| ↑ | $d_2$ | $2^7$ | 128 |
| ↑ | $d_3$ | $2^8$ | 256 |
| ↑ | $d_4$ | $2^9$ | 512 |
| ↑ | $d_5$ | $2^{10}$ | 1024 |
| ↑ | $d_6$ | $2^{11}$ | 2048 |
| ↑ | $d_7$ | $2^{12}$ | 4096 |
| 19 binary | $d_8$ | $2^{13}$ | 8192 |
| bits | $d_9$ | $2^{14}$ | 16384 |
| ↓ | $d_{10}$ | $2^{15}$ | 32768 |
| ↓ | $d_{11}$ | $2^{16}$ | 65536 |
| ↓ | $d_{12}$ | $2^{17}$ | 131072 |
| ↓ | $d_{13}$ | $2^{18}$ | 262144 |
| ↓ | $d_{14}$ | $2^{19}$ | 524288 |
| ↓ | $d_{15}$ | $2^{20}$ | 1048576 |
| ↓ | $d_{16}$ | $2^{21}$ | 2097152 |
| ↓ | $d_{17}$ | $2^{22}$ | 4194304 |
| ↓ | $d_{18}$ | $2^{23}$ | 8388608 |

The maximum possible value for GF times $10^5$ in the preferred embodiment of the invention equals 99 times $10^5$ which equals 9,900,000. Referring to Table 5 above, $d_{18}$ equals 8,388,608 and $d_{17}$ equals 4,194,304. Bits $d_{18}$ and $d_{17}$ cannot both be true simultaneously, since the sum of $d_{18}$ and $d_{17}$, 12,581,912 exceeds 9,900,000. Bit $d_{18}$ equals 8,388,608 and $d_{16}$ equals 2,097,152. Bits $d_{18}$ and $d_{16}$ cannot both be true simultaneously since their sum, 10,485,760 exceeds 9,900,000. Conversely, if either $d_{17}$ or $d_{16}$ is true, $d_{18}$ must simultaneously be false.

For example, in the implementation of PROM $v_5$ in FIG. 3, advantage is taken of the fact that if the most significant binary bit $j_{46}$ is true, the next three bits $j_{45}$, $j_{44}$ and $j_{43}$ are simultaneously false. Conversely, if any one of $j_{45}$, $j_{44}$ or $j_{43}$ is true, $j_{46}$ is simultaneously false. The output of PROM $v_5$ does not exceed 15 and therefore no carry is generated in the addition process. The output of code converter 10 is implemented, in effect, into a table of binary numbers having a plurality of rows and columnar positions. Employing the above described characteristic that certain bits in each row of binary numbers will not simultaneously be true, groups of bits for inputs to each of the PROMs of the first level of logic 12 in FIG. 3 may be individually predetermined by those skilled in the art to minimize the number of PROMs required for addition.

Each BCD digit and each pair of BCD digits times a power of ten is converted to the identical binary value and arranged in a table as illustrated in FIG. 3 wherein each successive channel provides a higher weighted value based on a power of two in accordance with the binary system notation. Each converted BCD digit or pair of BCD digits times a power of ten results in the same number of zeroes to the right of the equivalent binary number as the number of the power of ten. The representation of a binary number times a power of two is accomplished by shifting the number to the left, thus resulting in zeros in the LSB portion of the number. The results described above are illustrated in the table of pairs of BCD digits times powers of ten shown in Table 3 above and in FIG. 3 for the first level of logic 12. This characteristic results in a reduction of the number of PROMs required in the first level of logic 12 to implement the addition of the table of binary bits in their columnar positions as shown in FIG. 3, since it is known that a plurality of bits in the LSB portion of each binary number are always zero.

In the preferred embodiment of the present invention, the first level of PROM addition is performed on a table of binary numbers as illustrated in FIG. 3. The one exception is for bits $a_0$-$a_3$ of FIG. 3 which are derived from BCD digit A and represent BCD bits as well as binary bits as described below.

Referring to FIGS. 1, 3, 4 and 5, the preferred embodiment for a binary adder is illustrated to provide for progressively reducing the columns of binary bits received from code converter 10 of FIG. 2. The bits are added in accordance with the columnar positions in FIG. 3 using the three logic levels 12, 14 and 16 illustrated. The first and second logic levels 12 and 14 are implemented in a particularly advantageous manner by employing special arrangements of individually programmed high speed PROMs in each of levels 12 and 14 which provides a significant reduction in the number of PROMs which would otherwise be required for this purpose. The resultant logic provided by levels 12 and 14 reduces the bits to be added in each column to no more than two bits per column. This permits each of the binary output bits $b_{00}$-$b_{69}$ of the equivalent binary number to then be readily provided by the third logic level 16 in FIGS. 1 and 5 using conventional adding and carry generation techniques.

Reference is now directed to FIG. 3 which schematically illustrates a preferred embodiment for the first logic level 12 of FIG. 1. The binary bits $b_{00}$-$b_{69}$ are illustrated in each of FIGS. 3, 4 and 5 for convenient identification of the particular binary bits and their respective column positions which are to be added by each of the 30 PROMs $v_0$-$v_5$, $w_0$-$w_5$, $x_0$-$x_5$, $y_0$-$y_5$, $z_0$-$z_5$ provided for in the first logic level 12. More specifically, it will be understood that the particular columns of binary bits to be added by each of the PROMs of the first logic level 12 shown in FIG. 3 are those columns containing the particular binary bits enclosed within the boundary line which represents each PROM. For example, PROM $y_0$ provides for the addition of the columns constituted by binary bits $b_3$, $b_4$, $b_5$, $c_1$, $c_2$, $c_3$ wherein binary bits $b_3$ and $c_1$ are in the $b_{04}$ column of the table, binary bits $b_4$ and $c_2$ are in the $b_{05}$ column of the table, and binary bits $b_5$ and $c_3$ are in the $b_{06}$ column of the table. Referring to FIG. 2, the BCD digit A converts directly to bits $a_0$-$a_3$ which comprises $a_0$, $a_1$, $a_2$, $a_3$ wherein $a_0$ is the least significant bit and $a_3$ is the most significant bit. Since a BCD digit cannot exceed the value of 9, if $a_3$ is true, $a_1$ and $a_2$ must simultaneously be false. Conversely if either $a_1$ or $a_2$ are true, $a_3$ must simultaneously be false.

Advantage is taken of various of the characteristics disclosed in the aforementioned commonly assigned patent application in choosing the PROM arrangement for the first logic level 12 in FIG. 3. The choice of binary inputs to each PROM is made so that the resultant output from each PROM does not produce a carry. This provides the advantage that no carries need be propagated or accounted for between PROMs in the first logic level 12 nor be of concern to the second logic level 14.

Each of the PROMs in the first logic level 12 as well as the code converter 10 may typically be implemented as a 256×4 bit PROM using, for example, a Fairchild 93427 integrated circuit chip. Such a 256×4 bit PROM provides a maximum of 8 inputs and 4 outputs. Judicious choice of bits to be received by each PROM is made so that the sum of these chosen input bits is never greater than 15 or 1111 so as to thereby prevent production of a carry from the PROM. The logic provided by the first logic level 12 is economically provided using a single level of PROMs operating in parallel and independently of each other, since there is no carry propagation required between the PROMs.

Each of the PROMs in the first logic level 12 illustrated in FIG. 3 is individually programmed to provide for proper addition of the particular columns of binary bits applied thereto. For this purpose, attention is directed to the following general equation which is used in determining the programming provided for a PROM in the first logic level 12 of the preferred embodiment of the invention being considered herein:

$$S = \sum_{k=1}^{n} W_k B_k \qquad (1)$$

where S is the binary sum provided by the PROM in response to the binary inputs applied thereto; n is the maximum number of inputs which the PROM is capable of receiving; $B_k = B_1, B_2—B_n$ identify the particular unique binary inputs which are applied to the PROM; and $W_k = W_1, W_2,—W_n$ are the respective weighting values for the binary inputs which the PROM has to be programmed to take into account in order for the PROM to provide the proper value of the sum S. Each weighting value is chosen to be representative of the column position of each binary bit. This is done by assigning power of 2 values (1, 2, 4, etc.) to the columns of binary bits to be added by the PROM (as shown in FIG. 3) beginning with the least significant column of bits (rightmost column) and proceeding to the most significant column (leftmost column). Thus, the least significant column is assigned a 1 value, the next least significant column (on the left) is assigned a 2 value, the next least significant column is assigned a 4 value, and so on. This column value is equal to the weighting value W in equation (1).

Also, in order that there be no carry from the PROM, the sum S from each PROM must satisfy the equation:

$$S \leq 2^q - 1 \qquad (2)$$

where q is the number of individual binary outputs available from the PROM.

As pointed out previously, in the illustrative PROM arrangement for the first logic level 12 shown in FIG. 3, each PROM is typically a 256×4 bit PROM providing a maximum of 8 inputs and 4 outputs. Thus, n=8 in equation (1) above and q=4 in equation (2) above. Equations (1) and (2) thus become:

$$S = \sum_{k=1}^{8} W_k B_k \qquad (1A)$$

$$S = \leq 2^4 - 1 = 15 \text{ or } 1111 \qquad (2A)$$

$$S = \leq 2^4 - 1 = 15 \text{ or } 1111 \qquad (2A)$$

The inputs to PROM $y_0$ in FIG. 3 are $b_3$, $b_4$, $b_5$, $c_1$, $c_2$, $c_3$. Equation (1A) above may be expanded as follows when applied to PROM $y_0$ in FIG. 3:

$$S_{y_0} = b_3 + c_1 + 2b_4 + 2c_2 + 4b_5 + 4c_3 \qquad (1B)$$

It should now be evident that a sum equation similar to equation (1B) above for PROM $y_0$ can also readily be provided in a like manner for each of the other PROMs in the first logic level 12 of FIG. 3. It is to be understood that when equation (1A) above is expanded when applied to PROM $z_0$, the maximum sum cannot exceed 15 since $a_2$ and $a_1$ must be false if $a_3$ is true, as explained above in relation to a BCD number not exceeding the value of 9.

It will be understood that each of the PROMs in FIG. 3 may be individually programmed by those skilled in the art to operate in conformance with its respective sum equation so as to thereby provide an output sum which will correctly represent the sum of the particular columns of binary bits designated to be added by the PROM as indicated in FIG. 3. Also, as described previously herein, in order to obtain the advantage of not having to be concerned with the production of a carry by the PROM, the sum is prevented from reaching a value which would produce a carry by judicious choice of the particular columns of binary bits which are to be added by the PROM while additionally taking advantage, in the case of PROM $z_0$, of the fact that a BCD digit cannot have a value greater than 9. Furthermore, it will be understood that the use of PROMs is well suited for implementing the preferred implementation shown in FIG. 3 because of the ease with which each PROM can be programmed to provide the individual programming required thereby in accordance with its respective sum equation without the need to change or add to the internal PROM hardware.

Next to be considered with reference to FIG. 4 is a preferred embodiment of the second logic level 14 shown generally in FIG. 1. It will be understood from the previous description of the preferred embodiment of the first logic level 12 shown in FIG. 3 that the PROM implementation illustrated provides for the addition of particular selected columns of binary bits required by the table of bits in FIG. 3. The second logic level 14 provides for the addition of selected columns of bits provided at the output of the first logic level 12 so as to continue the progressive reduction of bits in columns $b_{00}$–$b_{69}$ begun by the first logic level 12, the output of the second logic level 14 being such that no more than 2 bits per column remain to be added at the output of the second logic level 14. For this purpose, the second logic level 14 also preferably employs a PROM implementation, the 23 PROMs being designated in the preferred embodiment of FIG. 4 by the capital letters D-Z. It will be noted that, for easy comparison with FIG. 3, FIG. 4 repeats the $b_{00}$–$b_{69}$ identifications. In this regard it will be remembered that each of $b_{00}$–$b_{69}$ represents a respective bit of the equivalent binary number to which the applied BCD number is being coverted. It will also be remembered that the value of each of these bits $b_{00}$–$b_{69}$ is obtained by adding together all of the bits in the corresponding column in FIG. 3, taking into account any carries from previous columns.

Now considering FIG. 4 in more detail, it is to be understood that it illustrates the remaining additions required to be performed as a result of the additions performed by the first logic level 12 of FIG. 3. FIG. 4 employs a similar format to that of FIG. 3 with the particular columns of bits to be added by each of PROMs D-Z of FIG. 4 being those enclosed within the boundary line which represents each PROM. It is to be noted in FIG. 4 that the bits which were not applied to any of the PROMs in FIG. 3 for addition are transposed unchanged to FIG. 4 in their proper column positions as shown. The 4-bit outputs representing the sums of the additions performed by the PROMs of FIG. 3 are also transposed to FIG. 4 in their proper column positions. For purposes of identification, each of the four bits representing a PROM sum is indicated in FIG. 4 by the PROM reference symbol followed by a power of 2 number (1, 2, 4 or 8) identifying the order of significance of the bit. For example, the four bits representing the sum from PROM $y_0$ in FIG. 3 are indicated in FIG. 4 by the designations $y_{01}$, $y_{02}$, $y_{04}$, $y_{08}$ wherein $y_{01}$ is the least significant bit.

It is also to be noted with respect to FIG. 4 that the same type of 256×4 bit PROM may also be used for each of PROMs D-Z as is used for each of the PROMs in FIG. 3. It is further to be noted that, because of the very significant reductions in the numbers of bits in each column achieved by the PROM implementation of FIG. 3 for the particular choice of PROM size and example of BCD-to-binary conversion being considered herein for illustrative purposes, only the 23PROMs D-Z are required in the second logic level 14 in order to achieve the desired progressive reduction of bits to be added in each column to no more than 2 bits per column.

It is most advantageous in the preferred embodiment being considered herein for the second logic level in FIG. 4 that there be no carry from a PROM as explained previously. The particular bits chosen for application to each of PROMs D-Z in FIG. 4 are thus chosen to meet this requirement in the same manner as described in connection with the PROM implementation of FIG. 3.

Using the previously presented general equation (1) for the sum S and the same principles as employed for the PROMs in FIG. 3, the following sum equation for PROM Y in the particular implementation of FIG. 4 may be set forth as follows:

$$S_y = y_{08} + x_{01} + e_0 + 2x_{02} + 2d_3 + 4x_{04} + 4d_4$$

By following the example for PROM Y, the sum equations for the other PROMs in FIG. 4 may be set forth by one skilled in the art.

As previously pointed out herein, with regard to the particular preferred embodiment considered herein, the second logic level 14 in FIG. 4 reduces the bits to be added in columns $b_{00}$–$b_{69}$ to no more than 2 bits per column, thereby permitting conventional adding and carry generating circuitry to be economically provided in the third logic level 16 of FIG. 1 without detracting from the high speed operation provided by the PROM implementations of the first and second logic levels 12 and 14. A preferred embodiment of the third logic level 16 will now be considered in detail with reference to FIG. 5.

It will be noted that the third logic level 16 illustrated in FIG. 5 employs a similar format to that of FIGS. 3 and 4 and, like FIG. 4, repeats the $b_{00}$–$b_{69}$ column designations so as to readily indicate, in their appropriate columns, the remaining additions to be performed by the third logic level 16 on the bits applied thereto from the second logic level. In this regard, it is to be noted that the 4 bit outputs from each of PROMs D-Z of the second logic level 14 of FIG. 4 are represented in the third logic level 16 shown in FIG. 5 in the same manner as the outputs of the PROMs from the first logic level 12.

The preferred embodiment of the third logic level 16 shown in FIG. 5 will now be considered in more detail. It will be seen that the third logic level 16 typically comprises 16 4-bit binary adders 83–98 and 5 look-ahead carry generators 100–104. Each of adders 83–98 may, for example, be implemented using a Texas Instrument SN 74S181 integrated circuit chip and each carry generator may, for example, be implemented using a Texas Instrument SN 74S182 integrated circuit chip. The particular columns of bits applied to each of adders 83–98 in FIG. 5 for addition thereby are shown within the block designating each adder.

It will accordingly be understood from FIG. 5 that adders 83–98 serve to provide output bits $b_{07}$–$b_{69}$ of the equivalent binary number. As for the remaining output bits $b_{00}$–$b_{06}$ of the equivalent binary number, it will be understood that the least significant bit of BCD digit A in FIG. 2 is equal to $a_0$ and thus propagates without change through the logic levels, that bits $b_{01}$, $b_{02}$, $b_{03}$ are provided directly by PROM $z_0$ outputs $z_{01}$, $z_{02}$, $z_{04}$, respectively, and that bits $b_{04}$, $b_{05}$, $b_{06}$ are provided directly by PROM Z outputs $Z_1$, $Z_2$, $Z_4$, respectively.

Referring to FIGS 2, 3 and 4, a 256×4 bit PROM configuration is illustrated in the figures since such a choice permits use of a relatively simple, inexpensive and readily available integrated circuit chip. Other PROM input and output dimensions may be employed with various modifications within the spirit of the invention. It is also to be understood that the number of circuit elements employed in the figures may be chosen to accommodate the desired number of BCD digits to be converted. In the preferred embodiment, the BCD digits to be converted are illustrated in groupings by pairs of digits, by they may be grouped by threes, fours and so on within the spirit of the invention.

The operation of the BCD to binary converter, in accordance with the preferred embodiment of the invention, is asynchronous without the need for a clock. Each PROM performs in parallel and independent of any other PROM in the logic. A number to be converted enters the input register 8 of FIG. 1 and the bits appearing in the output register 18 are a valid binary representation of the BCD input. If a different number is entered into the input register 8, the output register 18 will change accordingly to provide a valid binary representation of the new number.

The embodiment of the invention as described herein is by example only and is not intended to limit the embodiment to the specific description since many variations in construction, arrangement, use and operation are possible by those skilled in the art without departing from the scope of the invention. Accordingly, the present invention is to be considered as including all possible modifications and variations coming within the scope of the invention as defined by the appended claims.

What is claimed is:

1. Apparatus for converting an input binary coded decimal (BCD) number into an equivalent output binary number comprising:

input means for providing input binary signals representing the digits of said input BCD number;

conversion means responsive to said input binary signals for producing first binary signals representing the binary values of the least significant BCD digit of said input BCD number and second binary signals representing the significant binary digits of the equivalent binary numbers obtained by the separate conversion of different successive pairs of the remaining BCD digits of said input BCD number into true binary form taking into account the order of significance of each pair in said input BCD number;

each of said equivalent binary numbers being representable in the form $a_0 a_1 a_2 \ldots a_m$ times $2^n$, wherein $a_0 a_1 a_2 \ldots a_m$ are the significant digits of the equivalent binary number, m is the number of significant digits, and n has a value which provides the proper magnitude of the equivalent number; and binary adder means for adding said first and second binary signals in columns formed by taking into account their order of significance as indicated by their $2^n$ values for producing output binary signals representing said output binary number.

2. The invention in accordance with claim 1, wherein said conversion means includes a plurality of PROM groups, one group for each of said different successive pairs, wherein each PROM group is adapted to receive the particular ones of said input binary signals corresponding to a respective pair except for the least significant binary signal thereof, and wherein each PROM group operates to provide output binary signals representing all of the significant binary digits of its respective equivalent binary number except for the least significant binary digit.

3. The invention in accordance with claim 2, wherein the least significant binary digit of each equivalent number is directly provided by said conversion means as the least significant bit of the least significant BCD digit of each pair.

4. The invention in accordance with claim 1, 2 or 3, wherein said binary adder means includes a plurality of levels of logic circuitry, and wherein at least one logic level includes a plurality of individually programmed PROMs.

5. The invention in accordance with claim 4, wherein each PROM of said at least one logic level is chosen such that no carry is generated therefrom in response to the addition performed on the bits applied thereto taking into account that a BCD digit cannot exceed a value of 9.

6. The invention in accordance with claim 4, wherein at least another one of said levels of logic receives binary inputs comprised of PROM binary output signals from said at least one level along with not-yet-added binary signals for providing binary output signals representing the addition thereof.

7. The invention in accordance with claim 6, wherein said at least one of said levels of logic and said at least another one of said levels of logic operate to progressively reduce the signals to be added so that no more than two binary signals per column remain to be added, and wherein a final level of logic is provided for adding the remaining bits required to be added for producing binary signals representing the true binary form of said decimal number.

* * * * *

UNITED STATES PATENT AND TRADEMARK OFFICE
CERTIFICATE OF CORRECTION

PATENT NO. : 4,325,056
DATED : April 13, 1982
INVENTOR(S) : Daniel P. Wiener

It is certified that error appears in the above-identified patent and that said Letters Patent is hereby corrected as shown below:

Column 6, line 65 should read

| Decimal | BCD | Binary |
|---------|-----------|--------|
| 45 | 0100 0101 ↑ LSB | 101101 ↑ LSB |

Column 7, line 4 should read

| Decimal | BCD | Binary |
|---------|-----------|--------|
| 46 | 0100 0110 ↑ LSB | 101110 ↑ LSB |

Signed and Sealed this

First Day of March 1983

[SEAL]

Attest:

GERALD J. MOSSINGHOFF

Attesting Officer    Commissioner of Patents and Trademarks